United States Patent
Nakagawara

(10) Patent No.: US 8,680,867 B2
(45) Date of Patent: Mar. 25, 2014

(54) BATTERY MONITORING CIRCUIT AND BATTERY MONITORING SYSTEM

(75) Inventor: Chikashi Nakagawara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 363 days.

(21) Appl. No.: 13/232,783

(22) Filed: Sep. 14, 2011

(65) Prior Publication Data
US 2012/0182019 A1     Jul. 19, 2012

(30) Foreign Application Priority Data

Jan. 17, 2011   (JP) ................................ 2011-006868

(51) Int. Cl.
*G01N 27/416*   (2006.01)
*H02J 7/00*     (2006.01)

(52) U.S. Cl.
USPC ........... 324/426; 324/433; 320/116; 320/120; 320/134

(58) Field of Classification Search
USPC ................... 324/426, 433; 320/116, 120, 134
See application file for complete search history.

(56) References Cited

U.S. PATENT DOCUMENTS

| 4,529,965 | A  | * | 7/1985  | Lee ................. | 341/122 |
| 5,600,247 | A  | * | 2/1997  | Matthews ........... | 324/426 |
| 6,340,889 | B1 | * | 1/2002  | Sakurai .............. | 324/433 |
| 6,664,761 | B2 |   | 12/2003 | Yudahira et al. |         |
| 7,352,155 | B2 | * | 4/2008  | Li et al. .............. | 320/118 |
| 7,397,221 | B2 | * | 7/2008  | Sakuma et al. ..... | 320/134 |
| 7,535,199 | B2 | * | 5/2009  | Kimura et al. ...... | 320/121 |
| 7,583,057 | B2 | * | 9/2009  | Morita .............. | 320/118 |
| 7,812,568 | B2 |   | 10/2010 | Yonezawa |         |
| 8,212,523 | B2 | * | 7/2012  | Tatebayashi et al. ........ | 320/118 |
| 2001/0011881 | A1 | * | 8/2001  | Emori et al. .................. | 320/116 |
| 2008/0150516 | A1 |   | 6/2008  | Yonezawa |         |
| 2008/0278172 | A1 | * | 11/2008 | Miyamoto ................. | 324/433 |
| 2009/0102421 | A1 | * | 4/2009  | Imai .......................... | 320/118 |
| 2009/0179650 | A1 | * | 7/2009  | Omagari .................... | 324/433 |

FOREIGN PATENT DOCUMENTS

| JP | 2002-350472    | 12/2002 |
| JP | 2003-254998    | 9/2003  |
| JP | 2003-284253 A  | 10/2003 |
| JP | 2008-145180 A  | 6/2008  |
| JP | 2009-069056    | 4/2009  |
| JP | 2009-192302    | 8/2009  |

OTHER PUBLICATIONS

Japanese Office Action mailed Oct. 1, 2013 in Japanese Application No. 2011-006868.

* cited by examiner

*Primary Examiner* — M'Baye Diao
(74) *Attorney, Agent, or Firm* — Knobbe, Martens, Olson & Bear, LLP

(57) ABSTRACT

A battery monitoring circuit monitors voltages of a plurality of secondary cells connected in series. The battery monitoring circuit comprises a first switch element, a second switch element, a third switch element, and a first capacitor. The battery monitoring circuit comprises an operational amplifier of which an inverting input terminal is connected to a second end of the first capacitor, a non-inverting input terminal is connected to a fixed potential, and an output is connected to the second end of the first capacitor. The battery monitoring circuit comprises an A/D converter which performs analog-to-digital conversion on a signal output by the operational amplifier and outputs an obtained digital signal. The battery monitoring circuit comprises a control circuit which performs on/off control on the first to third switch elements and controls operations of the operational amplifier and the A/D converter.

20 Claims, 8 Drawing Sheets

1000

BATTERY MONITORING CIRCUIT AND BATTERY MONITORING SYSTEM

CROSS-REFERENCE TO RELATED APPLICATION

This application is based upon and claims the benefit of priority from the prior Japanese Patent Application No. 2011-006868, filed on Jan. 17, 2011, the entire contents of which are incorporated herein by reference.

BACKGROUND

1. Field

Embodiments described herein relate generally to a battery monitoring circuit and a battery monitoring system.

2. Background Art

A battery monitoring circuit that detects abnormality of each voltage of plural secondary cells that are used for batteries of hybrid cars and electric vehicles (EVs) and are connected in series is known.

For example, the battery monitoring circuit according to the related art is configured by using two sets of switch groups to select voltages of terminals between cells and connecting one of the switch groups to one end of a capacitor and connecting the other switch group to the other end of the capacitor.

According to the operation of the battery monitoring circuit according to the related art, first, upper and lower terminals of target cells are connected to both ends of the capacitor to equalize a voltage between the terminals of the capacitor to a cell voltage. Next, after the capacitor and the two switch groups are disconnected and both ends of the capacitor are opened, using a set of switches to be separately prepared, one end of the capacitor is connected to a reference voltage of an A/D converter and the other end of the capacitor is connected to an input of the A/D converter, and the cell voltage is measured.

By sequentially performing a series of operations of the battery monitoring circuit according to the related art on the target cells, voltages of all of the cells can be measured.

However, in the battery monitoring circuit according to the related art, the two sets of switch groups need to be provided to select the voltages of the terminals between the cells and a circuit scale increases. Further, one set of switches need to be provided between the capacitor and the A/D converter.

That is, a manufacturing cost of the battery monitoring circuit increases.

DETAILED DESCRIPTION

A battery monitoring circuit according to an embodiment monitors voltages of a plurality of secondary cells connected in series. The battery monitoring circuit comprises a first switch element of which a first end is connected to a first terminal, the first terminal being connected to a first potential line and to be connected to a negative electrode of a first secondary cell. The battery monitoring circuit comprises a second switch element of which a first end is connected to a second terminal and a second end is connected to a second end of the first switch element, the second terminal being to be connected to a positive electrode of the first secondary cell and a negative electrode of a second secondary cell. The battery monitoring circuit comprises a third switch element of which a first end is connected to a third terminal and a second end is connected to the second end of the first switch element, the third terminal being connected to a second potential line and to be connected to a positive electrode of the second secondary cell. The battery monitoring circuit comprises a first capacitor of which a first end is connected to the second end of the first switch element. The battery monitoring circuit comprises an operational amplifier of which an inverting input terminal is connected to a second end of the first capacitor, a non-inverting input terminal is connected to a fixed potential, and an output is connected to the second end of the first capacitor. The battery monitoring circuit comprises an A/D converter which performs analog-to-digital conversion on a signal output by the operational amplifier and outputs an obtained digital signal. The battery monitoring circuit comprises a control circuit which performs on/off control on the first to third switch elements and controls operations of the operational amplifier and the A/D converter.

Hereafter, embodiments will be described more specifically with reference to the drawings.

First Embodiment

Figure 1:
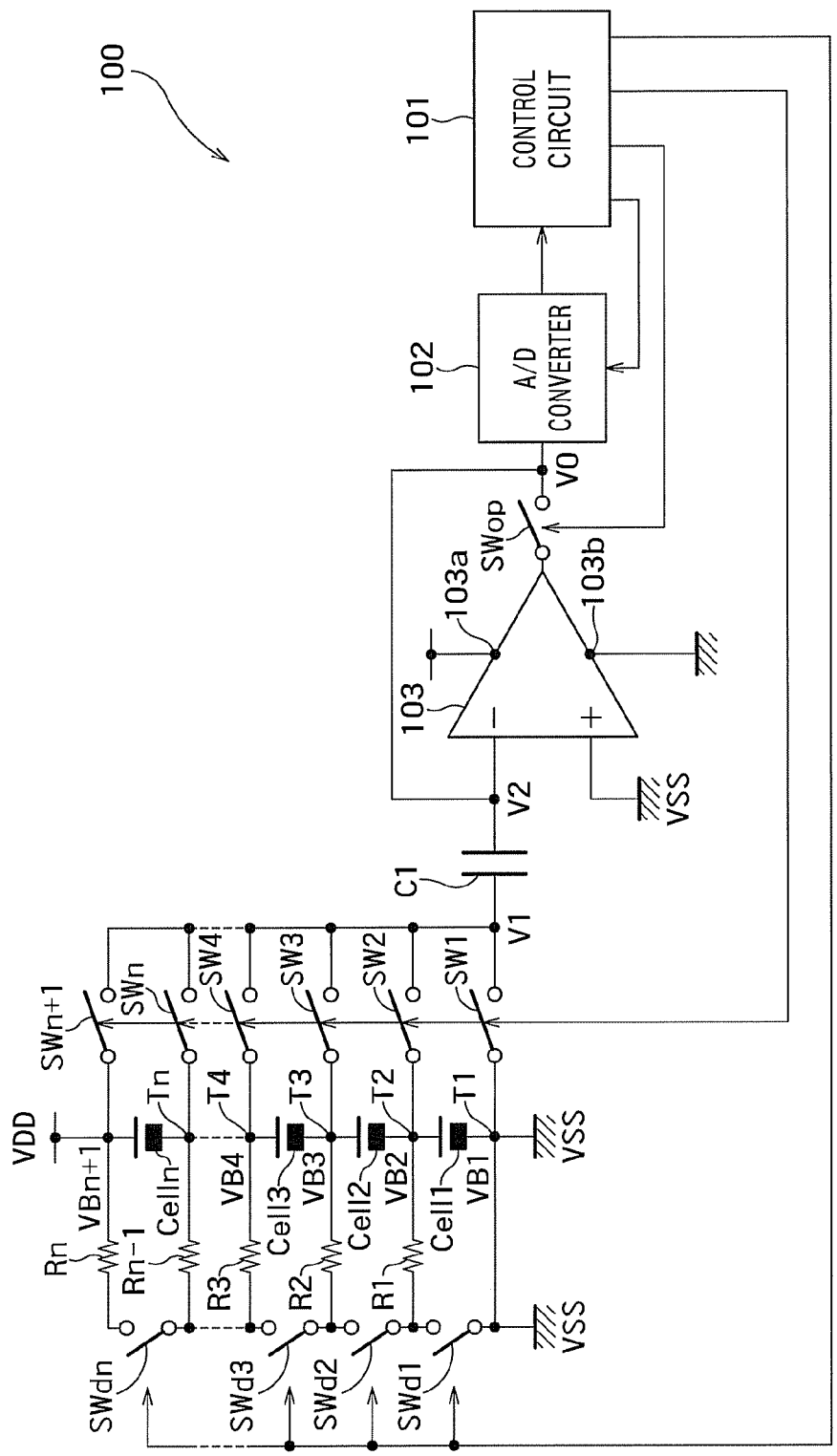
FIG. 1 is a diagram showing an example of the configuration of a battery monitoring system 1000 according to a first embodiment.

FIG. 1 is a diagram showing an example of the configuration of a battery monitoring system 1000 according to a first embodiment.

As illustrated in FIG. 1, the battery monitoring system 1000 includes plural (n (n≥2)) secondary cells Cell1 to Celln that are connected in series and a battery monitoring circuit 100 that monitors voltages of the secondary cells Cell1 to Celln.

The first to n-th secondary cells Cell1 to Celln are connected in series between a power supply VDD and a ground VSS. To positive electrodes of the first to n-th secondary cells Cell1 to Celln, second to (n+1)-th terminals T2 to Tn+1 are connected, respectively. Each of the first to n-th secondary cells Cell1 to Celln is, for example, a lithium ion secondary cell.

In this case, the battery monitoring circuit 100 includes a control circuit 101, an A/D converter 102, an operational amplifier 103, first to (n+1)-th switch elements SW1 to SWn+1, a first capacitor C1, first to n-th resistors R1 to Rn, and first to n-th discharging switch elements SWd1 to SWdn.

One end of the first switch element SW1 is connected to the first terminal T1 to be connected to the ground (first potential line) VSS and to connect a negative electrode of the first secondary cell Cell1.

One end of the second switch element SW2 is connected to the second terminal 12 to connect the positive electrode of the first secondary cell Cell1 and a negative electrode of the second secondary cell Cell2, and the other end thereof is connected to the other end of the first switch element SW1.

One end of the third switch element SW3 is connected to the third terminal 13 to be connected to a power supply (second potential line) VDD (through the third to n-th secondary cells Cell3 to Celln) and to connect the positive electrode of the second secondary cell Cell2, and the other end thereof is connected to the other end of the first switch element SW1.

The other switch elements SW4 to SWn+1 are connected in the same way as the above case.

As such, in the battery monitoring circuit 100, the number of switch elements to select the voltages of the terminals between the cells may be increased by an increase in the number of secondary cells to be connected in series. Therefore, the battery monitoring circuit 100 can reduce a circuit area as compared with the battery monitoring circuit according to the related art.

As illustrated in FIG. 1, the first discharging switch element SWd1 is connected in series to the first resistor R1, between the first terminal T1 and the second terminal 12. The first discharging switch element SWd1 is configured to be on/off controlled by the control circuit 101.

The second discharging switch element SWd2 is connected in series to the first resistor R1 and the second resistor R2, between the second terminal T2 and the third terminal 13. The second discharging switch element SWd2 is configured to be on/off controlled by the control circuit 101.

The other third to n-th discharging switch elements SWd3 to SWdn and the third to n-th resistors R3 to Rn are connected in the same way as the above case. The third to n-th discharging switch elements SWd3 to SWdn are configured to be on/off controlled by the control circuit 101.

The first to n-th discharging switch elements SWd1 to SWdn are controlled to be turned off when a normal operation is performed and when the voltage is measured.

One end of the first capacitor C1 is connected to the other end of the first switch element SW1.

An inverting input terminal of the operational amplifier 103 is connected to the other end of the first capacitor C1, and a non-inverting input terminal thereof is connected to a fixed potential (in this case, ground potential).

The operational amplifier 103 has a terminal 103a and a terminal 103b. The operational amplifier 103 is supplied with the operation current through the terminals 103a and 103b.

The operational amplifier 103 has an operation control switch element SWop to turn on/off an output thereof (control the operation of the operational amplifier 103). One end of the operation control switch element SWop is connected to an output terminal of the operational amplifier 103 and the other end thereof is connected to the inverting input terminal of the operational amplifier 103 and an input of the A/D converter 102. The operation control switch element SWop is configured to be on/off controlled by the control circuit 101 and to control the operation (output) of the operational amplifier 103.

The A/D converter 102 performs analog-to-digital conversion on a signal Vo output by the operational amplifier 103 through the operation control switch element SWop and outputs an obtained digital signal.

The control circuit 101 performs on/off control on the first to (n+1)-th switch elements SW1 to SWn+1 and controls the operations of the operational amplifier 103 and the A/D converter 102.

For example, when the control circuit 101 operates the operational amplifier 103 (turns on the output of the operational amplifier 103), the control circuit 101 turns on the operation control switch element SWop, such that the signal Vo at the other end of the operation control switch element SWop is changed according to a signal input to the inverting input terminal and the non-inverting input terminal of the operational amplifier 103. That is, the signal Vo is changed according to the output of the operational amplifier 103 (in this embodiment, this state is regarded as a state in which the operational amplifier 103 is operated).

Meanwhile, when the control circuit 101 stops the operation of the operational amplifier 103 (turns off the output of the operational amplifier 103), the control circuit 101 turns off the operation control switch element SWop, such that the output of the operational amplifier 103 changed according to the signal input to the inverting input terminal and the non-inverting input terminal is intercepted. That is, the signal Vo at the other end of the operation control switch element SWop is not changed according to the output of the operational amplifier 103 (in this embodiment, this state is regarded as a state in which the operational amplifier 103 is not operated).

The control circuit 101 acquires (detects) the voltages of the first to n-th secondary cells Cell1 to Celln according to a digital signal output by the A/D converter 101 and controls the first to n-th discharging switch elements SWd1 to SWdn.

For example, the control circuit 101 acquires the voltage of the first secondary cell Cell1, on the basis of the digital signal output by the A/D converter 101, as will described below. Then, for example, the control circuit 101 compares the voltage of the first secondary cell Cell1 and a predetermined threshold voltage. When it is determined that the voltage of the first secondary cell Cell1 is higher than the threshold voltage, the control circuit 101 decreases the voltage of the first secondary cell Cell1 (discharges the first secondary cell Cell1).

When the control circuit 101 decreases the voltage of the first secondary cell Cell1, the control circuit 101 turns on the first discharging switch element SWd1 from a state in which the first to n-th discharging switch elements SWd1 to SWdn are turned off. Thereby, the current flows to the first resistor R1, energy of the first secondary cell Cell1 is consumed, and the voltage of the first secondary cell Cell1 decreases.

Likewise, the control circuit 101 acquires the voltage of the second secondary cell Cell2, on the basis of the digital signal output by the A/D converter 101, as will described below. Then, for example, the control circuit 101 compares the voltage of the second secondary cell Cell2 and the threshold voltage. When it is determined that the voltage of the second secondary cell Cell2 is higher than the threshold voltage, the control circuit 101 decreases the voltage of the second secondary cell Cell2 (discharges the second secondary cell Cell2).

When the control circuit 101 decreases the voltage of the second secondary cell Cell2 (discharges the second secondary cell Cell2), the control circuit 101 turns on the second discharging switch element SWd2 from a state in which the first to n-th discharging switch elements SWd1 to SWdn are turned off. Thereby, the current flows to the first resistor R1 and the second resistor R2, energy of the second secondary cell Cell2 is consumed, and the voltage of the second secondary cell Cell2 decreases.

The control circuit 101 performs the same voltage control as the above case, with respect to the other secondary cells Cell3 to Celln.

Each of the first to (n+1)-th switch elements SW1 to SWn+1, the first to n-th discharging switch elements SWd1 to SWdn, and the operation control switch element SWop is composed of a MOS transistor, for example. In this case, the control circuit 101 controls a gate voltage of the MOS transistor that constitutes each switch element and each switch element is on/off controlled.

As described above, the battery monitoring system 1000 monitors the voltages of the plural secondary cells Cell1 to Celln that are connected in series.

According to the detected voltage, the battery monitoring system 1000 discharges the secondary cell of which a voltage level is higher than a regular level and controls each secondary cell such that a voltage level of each secondary cell becomes the regular level or less.

Thereby, when the secondary cell is the lithium ion secondary cell, a lifespan can be suppressed from being shortened due to overcharging.

Hereafter, an example of a specific operation to detect the voltage of the secondary cell by the battery monitoring circuit 100 having the above-described configuration will be described.

Figure 2:
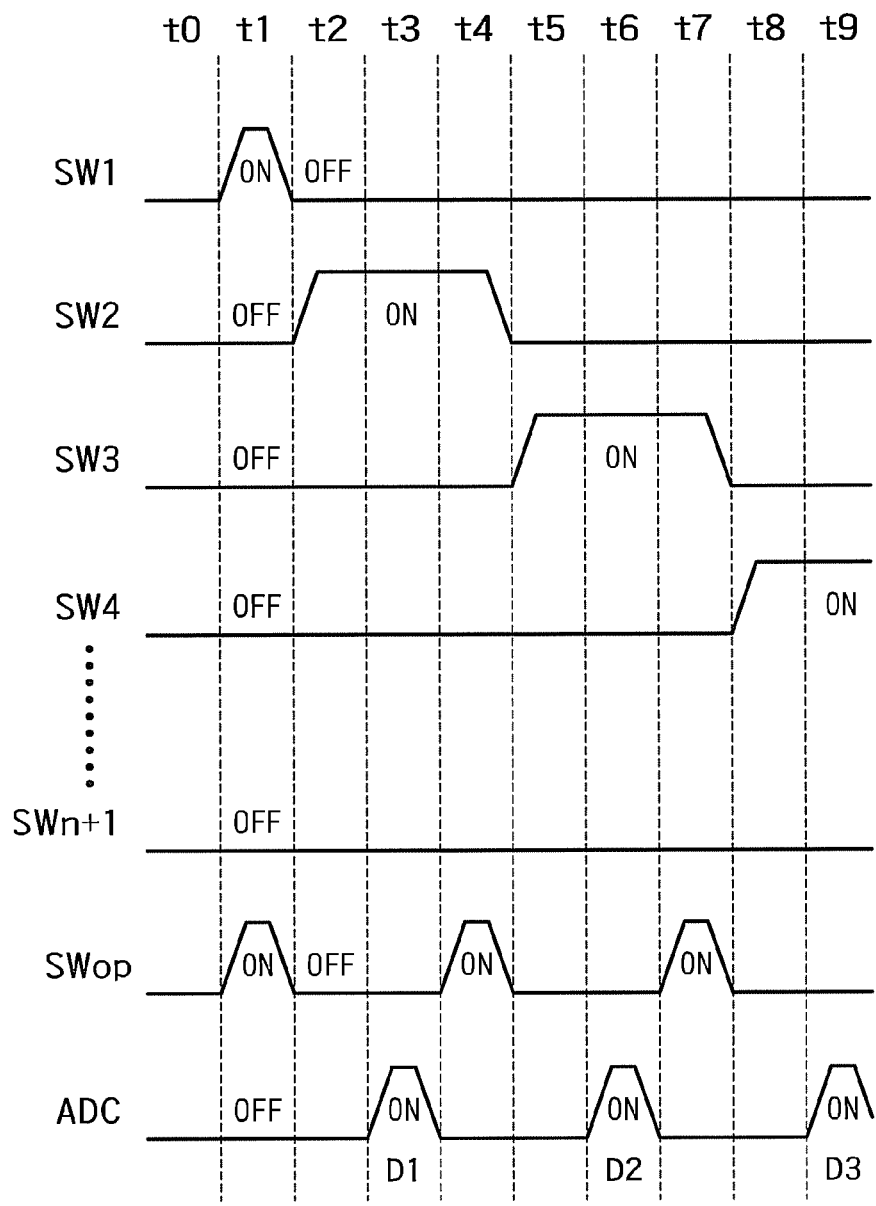
FIG. 2 is a diagram showing an example of waveforms of a signal to control each switch element and a signal to control the operation of the A/D converter when the battery monitoring circuit illustrated in FIG. 1 detects the voltage of the secondary cell.

FIG. 2 is a diagram showing an example of waveforms of a signal to control each switch element and a signal to control the operation of the A/D converter when the battery monitoring circuit illustrated in FIG. 1 detects the voltage of the secondary cell.

As illustrated in FIG. 2, in order to detect the first voltage (VB2−VB1) of the first secondary cell Cell1, from a state in which all of the first to n-th switch elements SW1 to SWn are turned off while the operations of the operational amplifier 103 and the A/D converter 102 are stopped (period t0), the control circuit 101 turns on the first switch element SW1, turns on the operation control switch element SWop, and operates the operational amplifier 103 (period t1).

Thereby, the voltage V1 of the other end (one end of the first capacitor C1) of the first switch element SW1 becomes the voltage VB1. Since the voltage VB1 is equal to the ground voltage, the voltage VB1 is 0 V. Therefore, the voltage V1 of one end of the first capacitor C1 becomes 0 V. By operating the operational amplifier 103, feedback is applied to the inverting input terminal of the operational amplifier 103 such that the voltage of the inverting input terminal becomes equal to the voltage of the non-inverting input terminal. As a result, the voltage V2 of the inverting input terminal that is connected to the other end of the first capacitor C1 becomes the ground voltage, that is, 0 V.

Thereby, the potential difference between both ends of the first capacitor C1 is the voltage V1−the voltage V2 and becomes 0 V.

Then, the control circuit 101 turns off the first switch element SW1, turns off the operation control switch element SWop, and stops the operation of the operational amplifier 103. Then, the control circuit 101 turns on the second switch element SW2 (period t2).

Thereby, the voltage V1 of one end of the first capacitor C1 becomes the voltage VB2. At this time, since the operational amplifier 103 is not operated (connection between the output terminal of the operational amplifier 103 and the first capacitor C1 is cut off), the potential difference between both ends of the first capacitor C1 is maintained and the voltage V2 of the other end of the first capacitor C1 becomes the voltage VB2.

Then, the control circuit 101 operates the A/D converter 102, outputs a first digital signal D1 based on the first voltage of the first secondary cell Cell1 (period t3), and stops the operation of the A/D converter 102 (period t4).

That is, at this time, since the voltage received by the A/D converter 102 becomes the voltage VB2, the control circuit 101 can acquire (detect) the voltage VB2 of the first secondary cell Cell1, on the basis of the first digital signal D1 output by the A/D converter 102.

Meanwhile, the control circuit 101 operates the operational amplifier 103 during the period t4 to detect the second voltage (VB3−VB2) of the second secondary cell Cell2 adjacent to the first secondary cell Cell1.

Thereby, the voltage V1 of one end of the first capacitor C1 is maintained at the voltage VB2. However, the voltage V2 of the other end of the first capacitor C1 becomes the ground voltage (0 V) by the feedback operation of the operational amplifier 103. Therefore, the potential difference between both ends of the first capacitor C1 becomes the voltage VB2.

Then, the control circuit 101 turns off the second switch element SW2 and stops the operation of the operational amplifier 103. Subsequently, the control circuit 101 turns on the third switch element SW3 (period t5).

Thereby, the voltage V1 of one end of the first capacitor C1 becomes the voltage VB3. At this time, since the operational amplifier 103 is not operated (connection between the output terminal of the operational amplifier 103 and the first capacitor C1 is cut off), the potential difference between both ends of the first capacitor C1 is maintained and the voltage V2 of the other end of the first capacitor C1 becomes the voltage VB3−the voltage VB2.

Then, the control circuit 101 operates the A/D converter 102, outputs a second digital signal D2 based on the second voltage of the second secondary cell Cell2 (period t6), and stops the operation of the A/D converter 102 (period t7).

That is, at this time, since the voltage received by the A/D converter 102 becomes the second voltage (VB3−VB2), the control circuit 101 can acquire (detect) the voltage (VB3−VB2) of the voltage of the second secondary cell Cell2, on the basis of the second digital signal D2 output by the A/D converter 102.

Thereafter, the control circuit 101 repeats the same operation and can detect the voltages of the third to n-th secondary cells Cell3 to Celln, on the basis of the digital signal output from the A/D converter 102.

By the above-described operation, the battery monitoring circuit 100 can accurately detect the voltage of each of the secondary cells that are connected in series.

As described above, in the battery monitoring circuit 100, since the number of switch groups to select the voltages of the terminals between the secondary cells can be set to be smaller than that in the battery monitoring circuit according to the related art, the circuit scale can be reduced.

As described above, according to the battery monitoring circuit in this embodiment, the circuit area can be reduced while the voltage of each of the secondary cells connected in series is accurately measured.

Second Embodiment

In the first embodiment described above, the case where the voltage input to the non-inverting input terminal of the operational amplifier is set to the ground voltage is described.

In a second embodiment, the case where the voltage input to the non-inverting input terminal of the operational amplifier is set to a reference voltage different from the ground voltage will be described.

Figure 3:
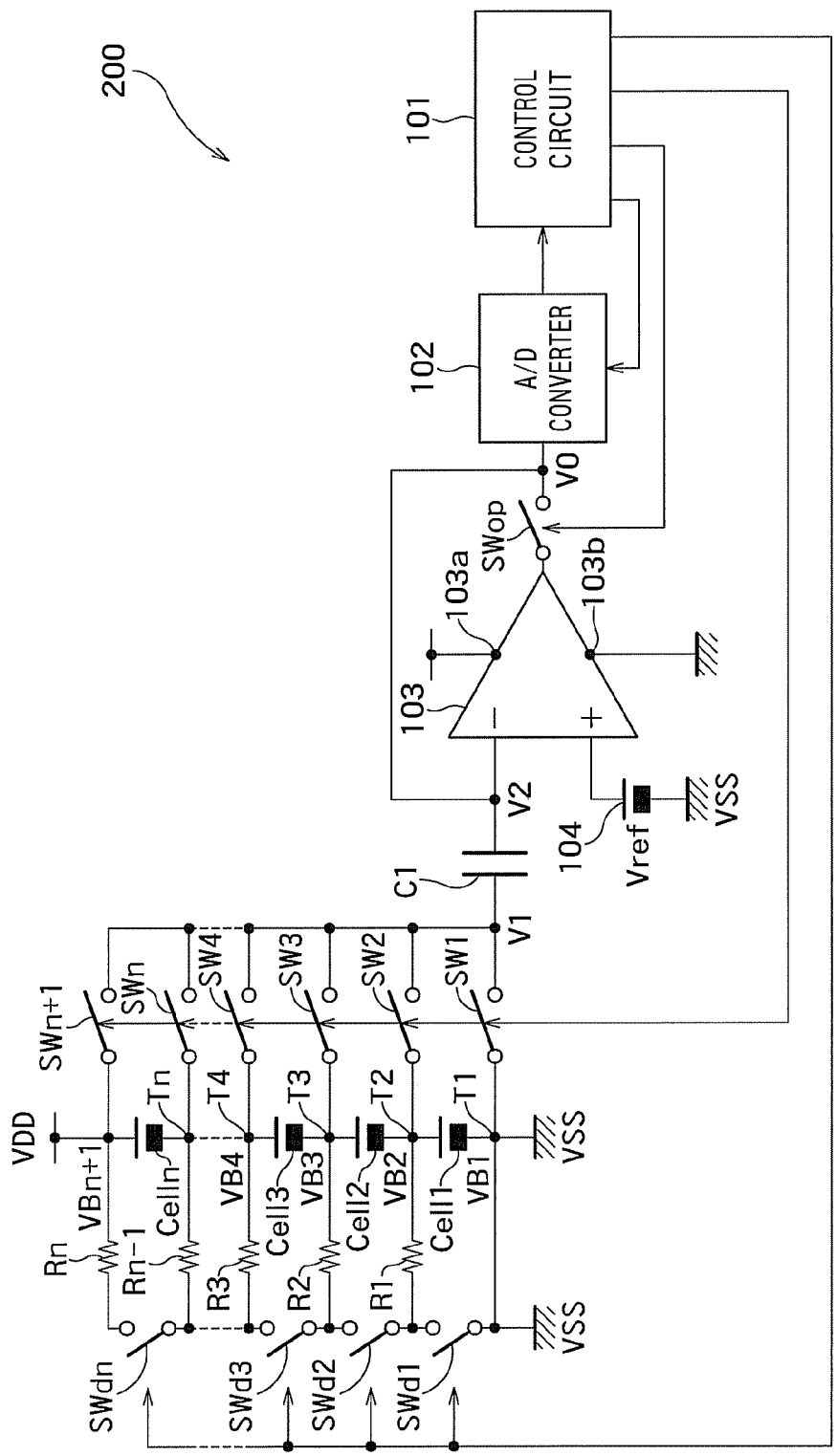
FIG. 3 is a diagram showing an example of the configuration of a battery monitoring system 2000 according to the second embodiment.

FIG. 3 is a diagram showing an example of the configuration of a battery monitoring system 2000 according to the second embodiment. In FIG. 3, the same reference numerals as those of FIG. 1 denote the same components as those of the first embodiment.

As illustrated in FIG. 3, the battery monitoring system 2000 includes plural (n (n≤2)) secondary cells Cell1 to Celln that are connected in series and a battery monitoring circuit 200 that monitors voltages of the secondary cells Cell1 to Celln.

The battery monitoring circuit 200 has the same configuration as that of the battery monitoring circuit 100 according to the first embodiment, except that the reference voltage (fixed voltage) Vref different from the ground voltage is input to the non-inverting input terminal of the operational amplifier 103 of the battery monitoring circuit 200.

That is, the battery monitoring circuit 200 further includes a reference power supply 104, as compared with the battery monitoring circuit 100 according to the first embodiment.

The reference power supply 104 is connected between the non-inverting input terminal of the operational amplifier 103 and the ground VSS and outputs the reference voltage Vref that is different from the ground voltage.

The other configuration of the battery monitoring circuit 200 is the same as that of the battery monitoring circuit 100 according to the first embodiment.

That is, similar to the first embodiment, the battery monitoring system 2000 monitors the voltages of the plural secondary cells Cell1 to Celln that are connected in series.

According to the detected voltage, the battery monitoring system 2000 discharges the secondary cell of which a voltage level is higher than a regular level and controls each secondary cell such that a voltage level of each secondary cell becomes the regular level or less.

Thereby, when the secondary cell is the lithium ion secondary cell, a lifespan can be suppressed from being shortened due to overcharging.

Hereinafter, an example of a specific operation to detect the voltage of the secondary cell by the battery monitoring circuit 200 having the above-described configuration will be described.

Figure 4:
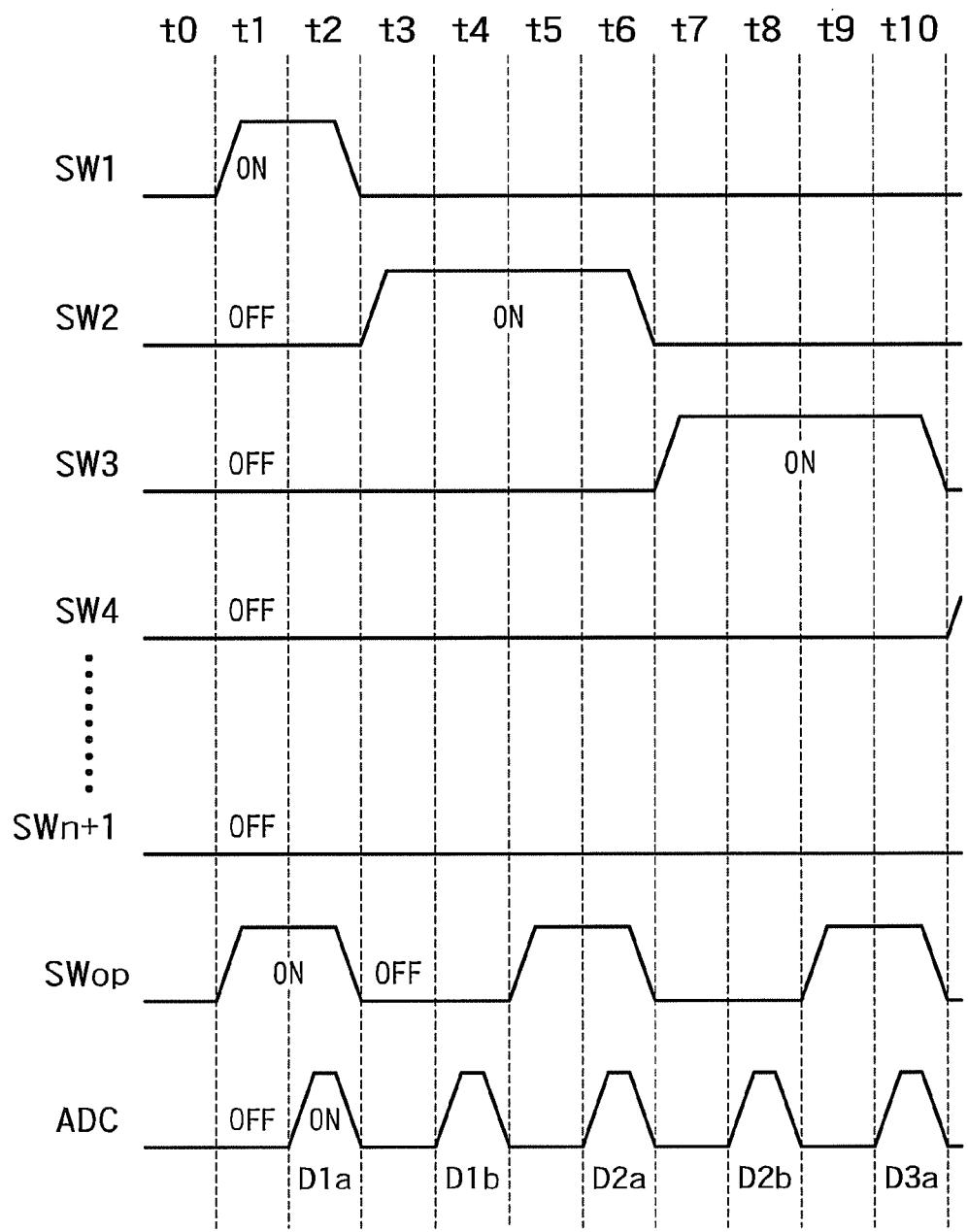
FIG. 4 is a diagram showing an example of waveforms of a signal to control each switch element and a signal to control the operation of the A/D converter, when the battery monitoring circuit illustrated in FIG. 3 detects the voltage of the secondary cell.

FIG. 4 is a diagram showing an example of waveforms of a signal to control each switch element and a signal to control the operation of the A/D converter, when the battery monitoring circuit illustrated in FIG. 3 detects the voltage of the secondary cell.

As illustrated in FIG. 4, in order to detect the first voltage (VB2−VB1) of the first secondary cell Cell1, from a state in which all of the first to n-th switch elements SW1 to SWn are turned off while the operations of the operational amplifier 103 and the A/D converter 102 are stopped (period t0), the control circuit 101 turns on the first switch element SW1, turns on the operation control switch element SWop, and operates the operational amplifier 103 (periods t1 to t2).

Thereby, the voltage V1 of the other end (one end of the first capacitor C1) of the first switch element SW1 becomes the voltage VB1. Since the voltage VB1 is equal to the ground voltage, the voltage VB1 is 0 V. Therefore, the voltage V1 of one end of the first capacitor C1 becomes 0 V. By operating the operational amplifier 103, feedback is applied to the inverting input terminal of the operational amplifier 103 such that the voltage of the inverting input terminal becomes equal to the voltage of the non-inverting input terminal. As a result, the voltage V2 of the inverting input terminal that is connected to the other end of the first capacitor C1 becomes the reference voltage Vref.

Thereby, the potential difference between both ends of the first capacitor C1 is the voltage V1−the voltage V2 and becomes the reference voltage Vref.

During the period t2, the control circuit 101 operates the A/D converter 102 and outputs a first digital signal D1*a*. That is, at this time, the voltage that is received by the A/D converter 102 and that corresponds to the first digital signal D1*a* becomes the reference voltage Vref.

Then, the control circuit 101 turns off the first switch element SW1 and stops the operations of the A/D converter 102 and the operational amplifier 103. Then, the control circuit 101 turns on the second switch element SW2 (period t3).

Thereby, the voltage V1 of one end of the first capacitor C1 becomes the voltage VB2. At this time, since the operational amplifier 103 is not operated (connection between the output terminal of the operational amplifier 103 and the first capacitor C1 is cut off), the potential difference between both ends of the first capacitor C1 is maintained, and the voltage V2 of the other end of the first capacitor C1 is represented by Equation 1.

$$V2 = Vref + VB2 - VB1 \quad (1)$$

Then, the control circuit 101 operates the A/D converter 102 and outputs a second digital signal D1*b* based on the first voltage of the first secondary cell Cell1 (period t4). Subsequently, the control circuit 101 stops the operation of the A/D converter 102 (period t5).

That is, at this time, the voltage that is received by the A/D converter 102 becomes the voltage (Vref+VB2−VB1).

Therefore, the control circuit 101 can acquire (detect) the voltage of the first secondary cell Cell1, on the basis of the difference between the second digital signal D1*b* and the first digital signal D1*a*, as represented by following Equation 2.

$$(Vref + VB2 - VB1) - Vref = VB2 - VB1 \quad (2)$$

That is, the potential difference between both ends of the first secondary cell Cell1 can be measured without an error based on the voltage (ground voltage) VB1 and the reference voltage Vref.

Meanwhile, the control circuit 101 operates the operational amplifier 103 during the period t5 to detect the second voltage (VB3−VB2) of the second secondary cell Cell2 adjacent to the first secondary cell Cell1.

Thereby, the voltage V1 of one end of the first capacitor C1 is maintained at the voltage VB2. However, the voltage V2 of the other end of the first capacitor C1 becomes the reference voltage Vref by the feedback operation of the operational amplifier 103. Therefore, the potential difference between both ends of the first capacitor C1 becomes the voltage (VB2−Vref).

Then, the control circuit 101 operates the A/D converter 102 and outputs a third digital signal D2*a* (period t6). That is, at this time, the voltage that is received by the A/D converter 102 and that corresponds to the third digital signal D2*a* becomes the reference voltage Vref.

Then, the control circuit 101 turns off the second switch element SW2, stops the operations of the A/D converter 102 and the operational amplifier 103, and turns off the third switch element SW3 (period t7).

Thereby, the voltage V1 of one end of the first capacitor C1 becomes the voltage VB3. At this time, since the operational amplifier 103 is not operated (connection between the output terminal of the operational amplifier 103 and the first capacitor C1 is cut off), the potential difference between both ends of the first capacitor C1 is maintained, and the voltage V2 of the other end of the first capacitor C1 is represented by Equation 3.

$$V2 = Vref + VB3 - VB2 \quad (3)$$

Then, the control circuit 101 operates the A/D converter 102, outputs a fourth digital signal D2b based on the second voltage of the second secondary cell Cell2 (period t8). Subsequently, the control circuit 101 stops the operation of the A/D converter 102 (period t9).

That is, at this time, the voltage that is received by the A/D converter 102 becomes the voltage (Vref+VB3−VB2).

Therefore, the control circuit 101 can acquire (detect) the voltage of the second secondary cell Cell2, on the basis of the difference between the fourth digital signal D2b and the third digital signal D2a, as represented by following Equation 4.

$$(Vref + VB3 - VB2) - Vref = VB3 - VB2 \quad (4)$$

That is, the potential difference between both ends of the second secondary cell Cell2 can be measured without an error based on the voltage (ground voltage) VB1 and the reference voltage Vref.

Thereafter, the control circuit 101 repeats the same operation and can detect the voltages of the third to n-th secondary cells Cell3 to Celln, on the basis of the digital signal output from the A/D converter 102.

In general, in the case of a single power supply, since the voltage equal to or lower than the ground voltage cannot be handled by the operational amplifier, it is difficult to handle the voltages approximated to the ground voltage.

Therefore, it is advantageous that the battery monitoring circuit 200 can easily perform the operation using the reference voltage Vref that is slightly offset from the ground voltage.

Similar to the first embodiment, in the battery monitoring circuit 200, since the number of switch groups to select the voltages of the terminals between the secondary cells can be set to be smaller than that in the battery monitoring circuit according to the related art, the circuit scale can be reduced.

As described above, according to the battery monitoring circuit in this embodiment, the circuit area can be reduced while the voltage of each of the secondary cells connected in series is accurately measured.

The operation of the second embodiment may be applied to the battery monitoring circuit 100 according to the first embodiment, and the voltage of each secondary cell may be detected. In particular, the grounds of the circuit are apart and the ground voltage (voltage VB0) and the ground voltage input to the non-inverting input terminal of the operational amplifier 103 may become different. In this case, the difference of the ground voltages is offset by applying the operation according to the second embodiment to the battery monitoring circuit 100, and the measurement error can be reduced.

Third Embodiment

In the first and second embodiments described above, the example of the configuration where the battery monitoring circuit controls the operation of the operational amplifier to detect the voltage of the secondary cell is described.

In a third embodiment, an example of the configuration where a capacitor is connected between an input and an output of the operational amplifier and the battery monitoring circuit controls the charge of the capacitor to detect the voltage of the secondary cell will be described.

Figure 5:
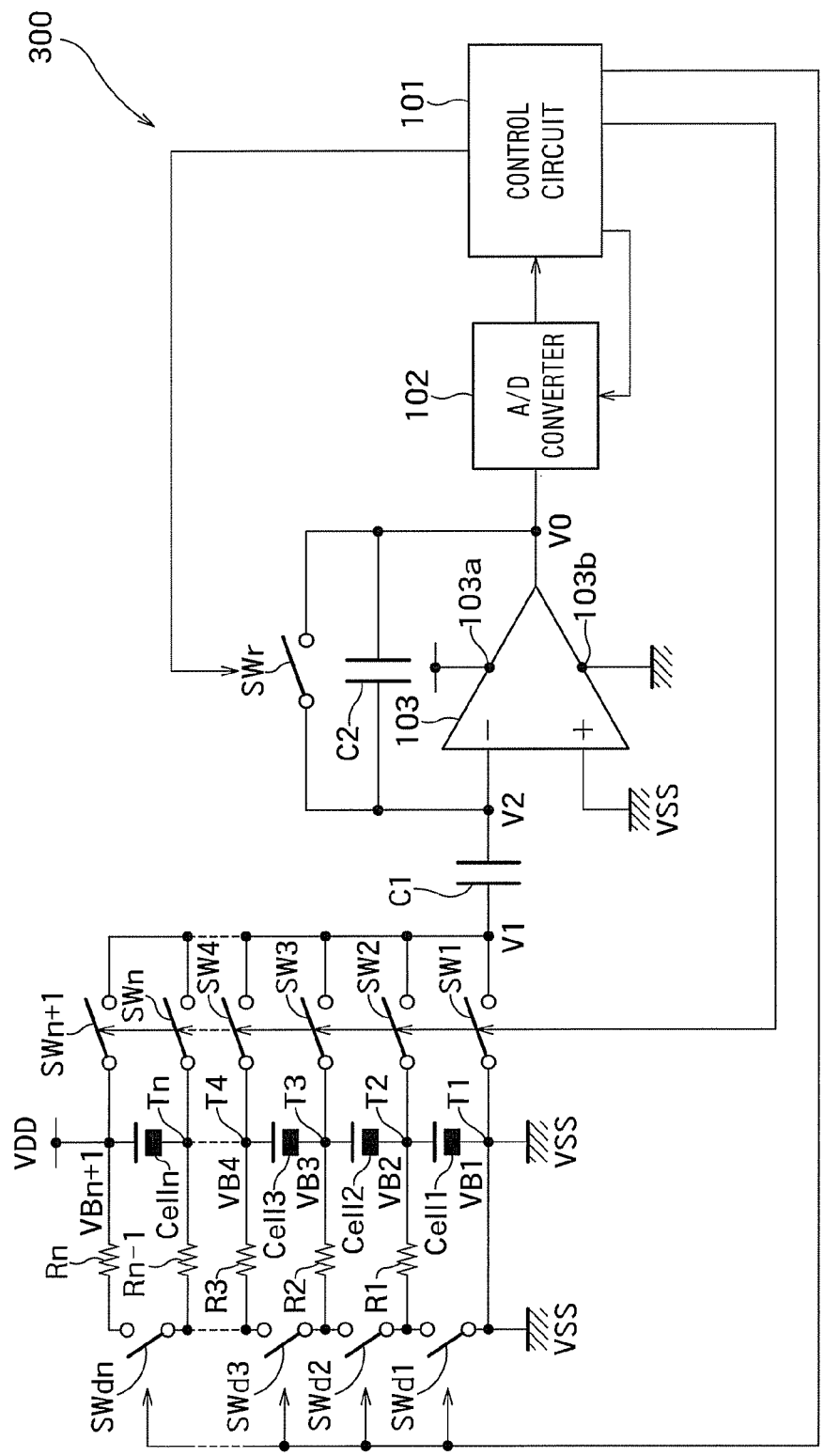
FIG. 5 is a diagram showing an example of the configuration of a battery monitoring system 3000 according to the third embodiment.

FIG. 5 is a diagram showing an example of the configuration of a battery monitoring system 3000 according to the third embodiment. In FIG. 5, the same reference numerals as those of FIG. 1 denote the same components as those of the first embodiment.

As illustrated in FIG. 5, the battery monitoring system 3000 includes plural (n (n≥2)) secondary cells Cell1 to Celln that are connected in series and a battery monitoring circuit 300 that monitors voltages of the secondary cells Cell1 to Celln.

The battery monitoring circuit 300 has the same configuration as that of the battery monitoring circuit 100 according to the first embodiment, except that the operation control switch element SWop is not provided and a second capacitor C2 and a refresh switch element SWr are connected in parallel, between the input and the output of the operational amplifier 103 of the battery monitoring circuit 300.

That is, as compared with the battery monitoring circuit 100 according to the first embodiment, in the battery monitoring circuit 300, the operation control switch element SWop is not provided and the second capacitor C2 and the refresh switch element SWr that are connected in parallel, between the input and the output of the operational amplifier 103, are further provided.

The second capacitor C2 is connected between the inverting input terminal of the operational amplifier 103 and the output of the operational amplifier 103.

The refresh switch element SWr is connected in parallel to the second capacitor C2, between the inverting input terminal of the operational amplifier 103 and the output of the operational amplifier 103.

In the third embodiment, the control circuit 101 performs on/off control on the first to (n+1)-th switch elements SW1 to SWn+1, the first to n-th discharging switch elements SWd1 to SWdn, and the refresh switch element SWr, and controls the operation of the A/D converter 102.

The other configuration of the battery monitoring circuit 300 is the same as that of the battery monitoring circuit 100 according to the first embodiment.

That is, similar to the first embodiment, the battery monitoring system 3000 monitors the voltages of the plural secondary cells Cell1 to Celln that are connected in series.

According to the detected voltage, the battery monitoring system 3000 discharges the secondary cell of which a voltage level is higher than a regular level, and controls each secondary cell such that a voltage level of each secondary cell becomes the regular level or less.

Thereby, when the secondary cell is the lithium ion secondary cell, a lifespan can be suppressed from being shortened due to overcharging.

Hereinafter, an example of a specific operation to detect the voltage of the secondary cell by the battery monitoring circuit 300 having the above-described configuration will be described.

Figure 6:
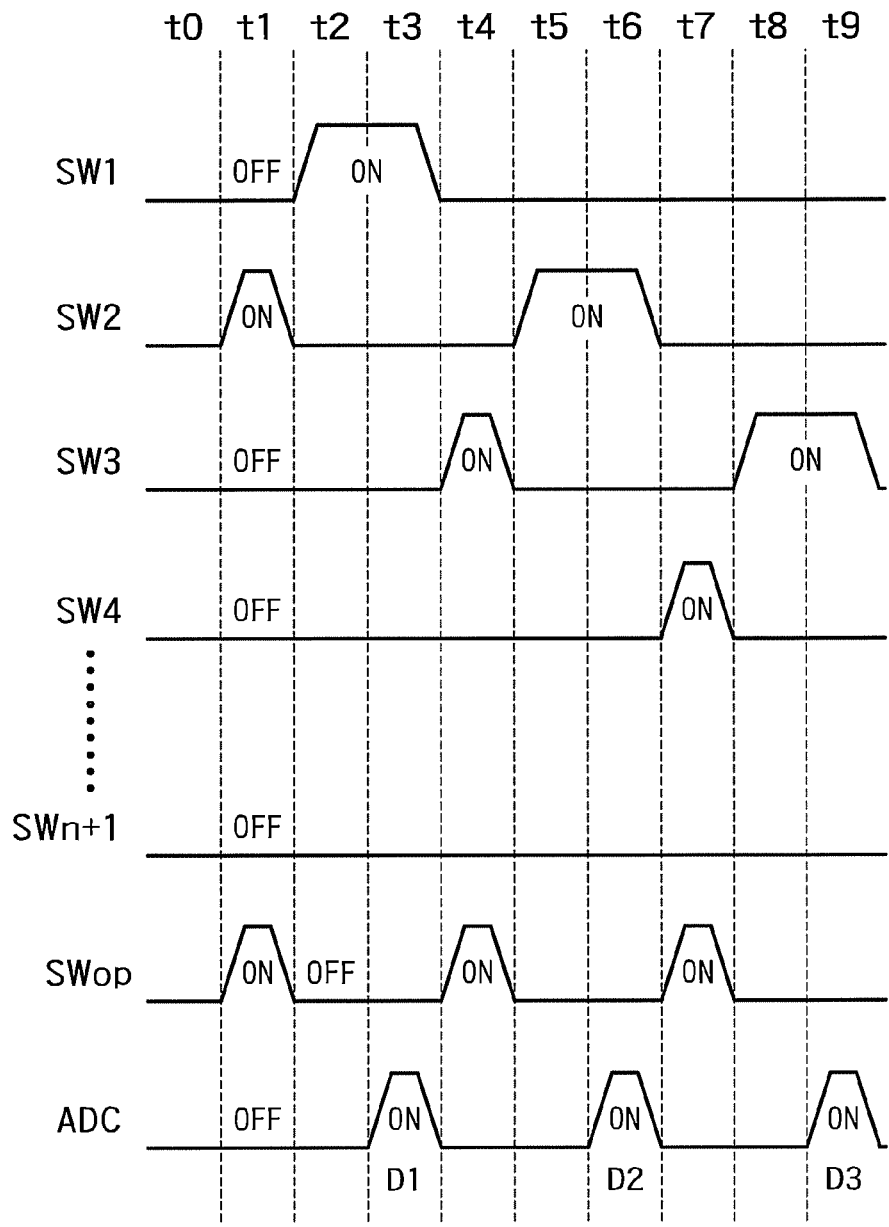
FIG. 6 is a diagram showing an example of waveforms of a signal to control each switch element and a signal to control the operation of the A/D converter, when the battery monitoring circuit illustrated in FIG. 5 detects the voltage of the secondary cell.

FIG. 6 is a diagram showing an example of waveforms of a signal to control each switch element and a signal to control the operation of the A/D converter, when the battery monitoring circuit illustrated in FIG. 5 detects the voltage of the secondary cell.

As illustrated in FIG. 6, in order to detect the first voltage (VB2−VB1) of the first secondary cell Cell1, from a state in which all of the first to (n+1)-th switch elements SW1 to SWn+1 and the refresh switch element SWr are turned off while the operation of the A/D converter 102 is stopped (period t0), the control circuit 101 turns on the second switch element SW2 and the refresh element SWr (period t1).

Thereby, the voltage V1 of one end of the first capacitor C1 becomes the voltage VB2. Since the operational amplifier 103 is operated, feedback is applied to the inverting input terminal of the operational amplifier 103 such that the voltage of the inverting input terminal becomes equal to the voltage of the non-inverting input terminal. As a result, the voltage V2 of the inverting input terminal that is connected to the other end of the first capacitor C1 becomes the ground voltage, that is, 0 V.

Thereby, the potential difference between both ends of the first capacitor C1 is the voltage V1−the voltage V2 and becomes VB2.

Then, the control circuit 101 turns off the second switch element SW2 and the refresh switch element SWr and turns on the first switch element SW1 (period t2).

Thereby, the voltage V1 of one end of the first capacitor C1 becomes the ground voltage, that is, 0 V. At this time, since the operational amplifier 103 is operated, the feedback control is applied and the voltage V2 of one end of the second capacitor C2 is maintained at the ground voltage.

Therefore, at this time, a charge variation Cv of the first capacitor C1 is represented by following Equation 5. The charge that corresponds to the charge variation Cv moves to the second capacitor C2.

$$Cv = C1 \times (VB2 - VB1) = C1 \times VB2 \tag{5}$$

Thereby, a potential difference Vd between both ends of the second capacitor C2 is represented by Equation 6.

$$Vd = Vo - V2 = Vo = C1 \times VB2/C2 \tag{6}$$

Then, the control circuit 101 operates the A/D converter 102 and outputs the first digital signal D1 based on the first voltage of the first secondary cell Cell1 (period t3). Then, the control circuit 101 turns off the first switch element SW1 and stops the operation of the A/D converter 102 (period t4).

That is, at this time, since the voltage Vo received by the A/D converter 102 is represented by $C1 \times VB2/C2$, the control circuit 101 can acquire (detect) the voltage (VB2−VB1) of the first secondary cell Cell1, on the basis of the first digital signal D1 output by the A/D converter 102.

Meanwhile, the control circuit 101 turns on the third switch element SW3 and the refresh switch element SWr to detect the second voltage (VB3−VB2) of the second secondary cell Cell2 adjacent to the first secondary cell Cell1 (period t4).

Thereby, the voltage V1 of one end of the first capacitor C1 becomes the voltage VB3. Since the operational amplifier 103 is operated, feedback is applied to the inverting input terminal of the operational amplifier 103 such that the voltage of the inverting input terminal becomes equal to the voltage of the non-inverting input terminal. As a result, the voltage V2 of the inverting input terminal that is connected to the other end of the first capacitor C1 becomes the ground voltage, that is, 0 V.

Thereby, the potential difference between both ends of the first capacitor C1 is the voltage V1−the voltage V2 and becomes VB3.

Then, the control circuit 101 turns off the third switch element SW3 and the refresh element SWr, and turns on the second switch element SW2 (period t5).

Thereby, the voltage V1 of one end of the first capacitor C1 becomes the voltage VB2. At this time, since the operational amplifier 103 is operated, the feedback control is applied and the voltage V2 of one end of the second capacitor C2 is maintained at the ground voltage.

Therefore, at this time, the charge variation Cv of the first capacitor C1 is represented by following Equation 7. The charge that corresponds to the charge variation Cv moves to the second capacitor C2.

$$Cv = C1 \times (VB3 - VB2) \tag{7}$$

Thereby, the potential difference Vd between both ends of the second capacitor C2 is represented by Equation 8.

$$Vd = Vo - V2 = Vo = C1 \times (VB3 - VB2)/C2 \tag{8}$$

Then, the control circuit 101 operates the A/D converter 102 and outputs the second digital signal D2 based on the first voltage of the second secondary cell Cell2 (period t6). Subsequently, the control circuit 101 turns off the second switch element SW2 and stops the operation of the A/D converter 102 (period t7).

That is, at this time, since the voltage Vo received by the A/D converter 102 is represented by $C1 \times (VB3-VB2)/C2$, the control circuit 101 can acquire (detect) the voltage (VB3−VB2) of the second secondary cell Cell2, on the basis of the second digital signal D2 output by the A/D converter 102.

Thereafter, the control circuit 101 repeats the same operation and can detect the voltages of the third to n-th secondary cells Cell3 to Celln, on the basis of the digital signal output from the A/D converter 102.

In this embodiment, since amplification or attenuation of the voltage is set by a capacity ratio of the first capacitor C1 and the second capacitor C2, a voltage level can be adjusted according to a cell voltage or an input dynamic range of the A/D converter 102. Therefore, effective measurement precision can be improved.

Similar to the first embodiment, in the battery monitoring circuit 300, since the number of switch groups to select the voltages of the terminals between the secondary cells can be set to be smaller than that in the battery monitoring circuit according to the related art, the circuit scale can be reduced.

As described above, according to the battery monitoring circuit in this embodiment, the circuit area can be reduced while the voltage of each of the secondary cells connected in series is accurately measured.

Fourth Embodiment

In the third embodiment described above, the case where the voltage input to the non-inverting input terminal of the operational amplifier is set to the ground voltage is described.

In the fourth embodiment, the case where the voltage input to the non-inverting input terminal of the operational amplifier is set to the reference voltage different from the ground voltage will be described.

Figure 7:
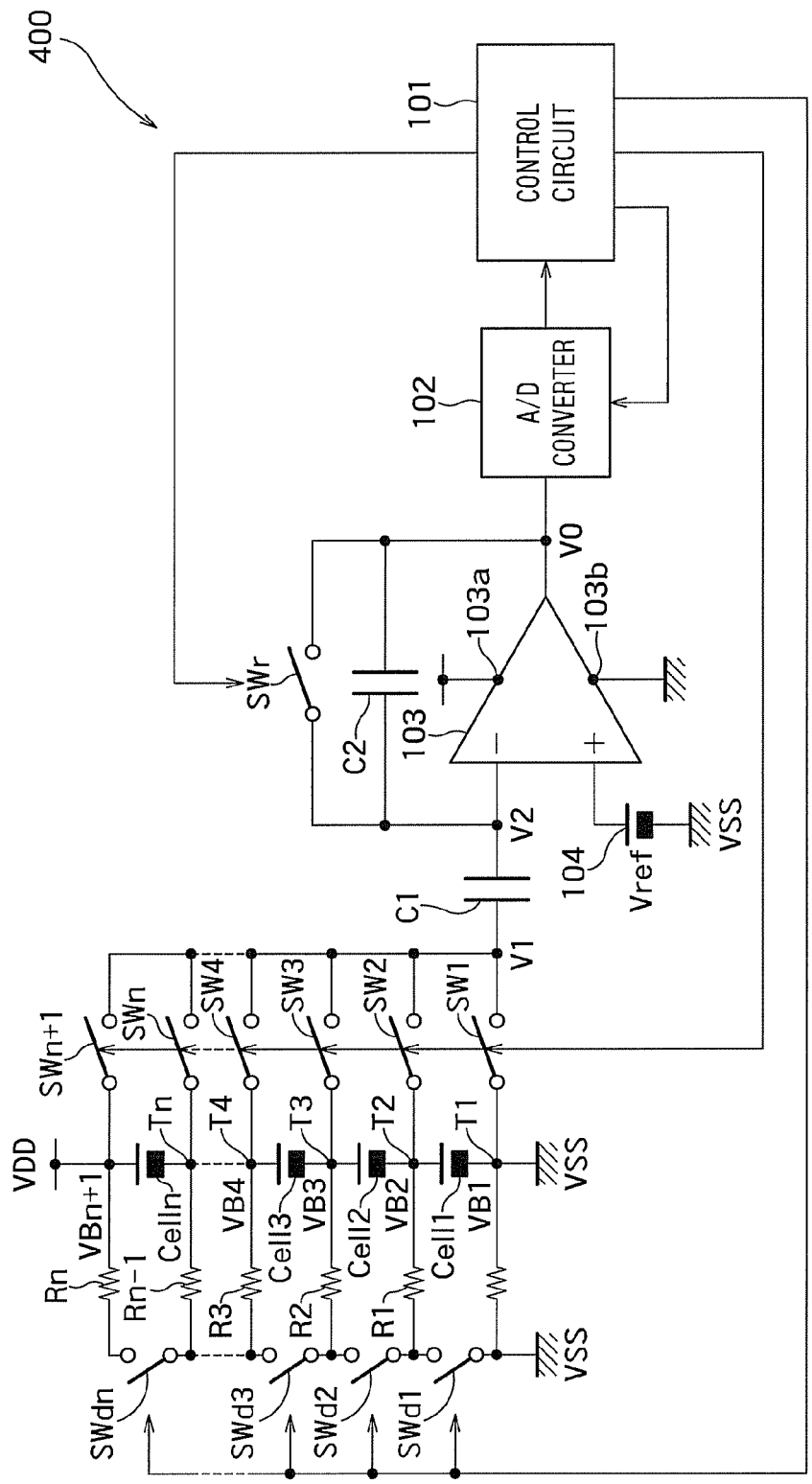
FIG. 7 is a diagram showing an example of the configuration of a battery monitoring system 4000 according to the fourth embodiment.

FIG. 7 is a diagram showing an example of the configuration of a battery monitoring system 4000 according to the fourth embodiment. In FIG. 7, the same reference numerals as those of FIG. 5 denote the same components as those of the third embodiment.

As illustrated in FIG. 7, the battery monitoring system 4000 includes plural (n (n≥2)) secondary cells Cell1 to Celln that are connected in series and a battery monitoring circuit 400 that monitors voltages of the secondary cells Cell1 to Celln.

The battery monitoring circuit 400 has the same configuration as that of the battery monitoring circuit 300 according to the third embodiment, except that the reference voltage (fixed voltage) Vref different from the ground voltage is input to the non-inverting input terminal of the operational amplifier 103 of the battery monitoring circuit 400.

That is, the battery monitoring circuit 400 further includes a reference power supply 104, as compared with the battery monitoring circuit 300 according to the third embodiment.

The reference power supply 104 is connected between the non-inverting input terminal of the operational amplifier 103 and the ground VSS and outputs the reference voltage Vref that is different from the ground voltage.

The other configuration of the battery monitoring circuit 400 is the same as that of the battery monitoring circuit 300 according to the third embodiment.

That is, similar to the third embodiment, the battery monitoring system 4000 monitors the voltages of the plural secondary cells Cell1 to Celln that are connected in series.

According to the detected voltage, the battery monitoring system 4000 discharges the secondary cell of which a voltage level is higher than a regular level and controls each secondary cell such that a voltage level of each secondary cell becomes the regular level or less.

Thereby, when the secondary cell is the lithium ion secondary cell, a lifespan can be suppressed from being shortened due to overcharging.

Hereinafter, an example of a specific operation to detect the voltage of the secondary cell by the battery monitoring circuit 400 having the above-described configuration will be described.

Figure 8:
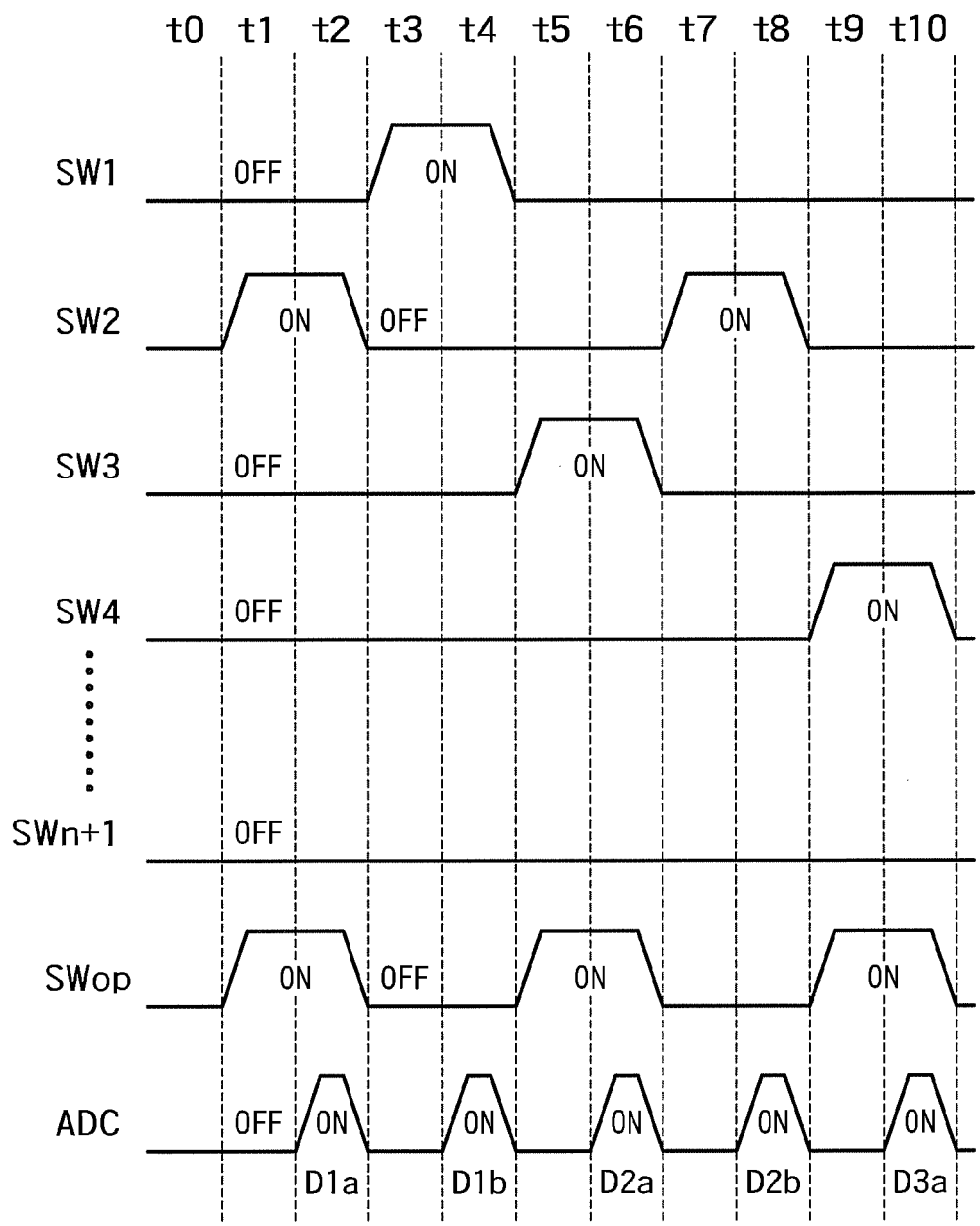
FIG. 8 is a diagram showing an example of waveforms of a signal to control each switch element and a signal to control the operation of the A/D converter when the battery monitoring circuit illustrated in FIG. 7 detects the voltage of the secondary cell.

FIG. 8 is a diagram showing an example of waveforms of a signal to control each switch element and a signal to control the operation of the A/D converter when the battery monitoring circuit illustrated in FIG. 7 detects the voltage of the secondary cell.

As illustrated in FIG. 8, in order to detect the first voltage (VB2−VB1) of the first secondary cell Cell1, from a state in which all of the first to (n+1)-th switch elements SW1 to SWn+1 and the refresh switch element SWr are turned off while the operation of the A/D converter 102 is stopped (period t0), the control circuit 101 turns on the second switch element SW2 and the refresh switch element SWr (period t1).

Thereby, the voltage V1 of one end of the first capacitor C1 becomes the voltage VB2. Since the operational amplifier 103 is operated, feedback is applied to the inverting input terminal of the operational amplifier 103 such that a voltage of the inverting input terminal becomes equal to the voltage of the non-inverting input terminal. As a result, the voltage V2 of the inverting input terminal connected to the other end of the first capacitor C1 and the voltage Vo become the reference voltage Vref.

Thereby, the potential difference between both ends of the first capacitor C1 is the voltage V1−the voltage V2 and becomes VB2−Vref.

Then, the control circuit 101 operates the A/D converter 102 and outputs the first digital signal D1a (period t2).

Then, the control circuit 101 stops the operation of the A/D converter 102 and turns off the second switch element SW2 and the refresh switch element SWr. Subsequently, the control circuit 101 turns on the first switch element SW1 (period t3).

Thereby, the voltage V1 of one end of the first capacitor C1 becomes the ground voltage, that is, 0 V. At this time, since the operational amplifier 103 is operated, the feedback control is applied and the voltage V2 of one end of the second capacitor C2 is maintained at the reference voltage Vref.

Therefore, at this time, the charge variation Cv of the first capacitor C1 is represented by following Equation 9. The charge that corresponds to the charge variation Cv moves to the second capacitor C2.

$$Cv=C1\times(VB2-VB1)=C1\times VB2 \quad (9)$$

Thereby, the potential difference Vd between both ends of the second capacitor C2 is represented by Equation 10.

$$Vd=Vo-V2=Vo-Vref=C1\times VB2/C2$$

$$Vo=Vref+C1\times VB2/C2 \quad (10)$$

Then, the control circuit 101 operates the A/D converter 102 and outputs the second digital signal D1b based on the first voltage of the first secondary cell Cell1 (period t4). Subsequently, the control circuit 101 stops the operation of the A/D converter (period t5).

That is, at this time, since the voltage Vo received by the A/D converter 102 is represented by Vref+C1×VB2/C2.

Therefore, the control circuit 101 can acquire (detect) the voltage of the first secondary cell Cell1, on the basis of the difference between the second digital signal D1b and the first digital signal D1a, as represented by following Equation 11.

$$Vref+C1\times VB2/C2-Vref=C1\times VB2/C2 \quad (11)$$

That is, the potential difference between both ends of the first secondary cell Cell1 can be measured without an error based on the voltage (ground voltage) VB1 and the reference voltage Vref.

Meanwhile, the control circuit 101 turns on the third switch element SW3 and the refresh switch element SWr during the period t5 to detect the second voltage (VB3−VB2) of the second secondary cell Cell2 adjacent to the first secondary cell Cell1.

Thereby, the voltage V1 of one end of the first capacitor C1 becomes the voltage VB3. Since the operational amplifier 103 is operated, feedback is applied to the inverting input terminal of the operational amplifier 103 such that the voltage of the inverting input terminal becomes equal to the voltage of the non-inverting input terminal. As a result, the voltage V2 of the inverting input terminal connected to the other end of the first capacitor C1, and the voltage Vo become the reference voltage Vref.

Thereby, the potential difference between both ends of the first capacitor C1 is the voltage V1−the voltage V2 and becomes VB3−Vref.

Then, the control circuit 101 operates the A/D converter 102 and outputs the third digital signal D2a (period t6).

Then, the control circuit 101 stops the operation of the A/D converter 102 and turns off the third switch element SW3 and the refresh switch element SWr. Subsequently, the control circuit 101 turns on the second switch element SW2 (period t7).

Thereby, the voltage V1 of one end of the first capacitor C1 becomes the voltage VB2. At this time, since the operational amplifier 103 is operated, the feedback control is applied, and the voltage V2 of one end of the second capacitor C2 is maintained at the reference voltage Vref.

Therefore, at this time, the charge variation Cv of the first capacitor C1 is represented by following Equation 12. The charge that corresponds to the charge variation Cv moves to the second capacitor C2.

$$Cv=C1\times(VB3-VB2) \quad (12)$$

Thereby, the potential difference Vd between both ends of the second capacitor C2 is represented by Equation 13.

$$Vd=Vo-V2=Vo-Vref=C1\times(VB3-VB2)/C2$$

$$Vo=Vref+C1\times(VB3-VB2)/C2 \quad (13)$$

Then, the control circuit 101 operates the A/D converter 102 and outputs the fourth digital signal D2b based on the first voltage of the second secondary cell Cell2 (period t8). Then, the control circuit 101 stops the operation of the A/D converter (period t9).

That is, at this time, since the voltage Vo received by the A/D converter 102 is represented by Vref+C1×(VB3−VB2)/C2.

Therefore, the control circuit 101 can acquire (detect) the voltage of the second secondary cell Cell2, on the basis of the difference between the fourth digital signal D2b and the third digital signal D2a, as represented by following Equation 14.

$$Vref+C1\times(VB3-VB2)/C2-Vref=C1\times(VB3-VB2)/C2 \quad (14)$$

That is, the potential difference between both ends of the second secondary cell Cell2 can be measured without an error based on the voltage (ground voltage) VB1 and the reference voltage Vref.

Thereafter, the control circuit 101 repeats the same operation and can detect the voltages of the third to n-th secondary cells Cell3 to Celln, on the basis of the digital signal output from the A/D converter 102.

In general, in the case of a single power supply, since the voltage equal to or lower than the ground voltage cannot be handled by the operational amplifier, it is difficult to handle the voltages approximated to the ground voltage.

Therefore, it is advantageous that the battery monitoring circuit 400 can easily perform the operation using the reference voltage Vref that is slightly offset from the ground voltage.

Similar to the first embodiment, in the battery monitoring circuit 400, since the number of switch groups to select the voltages of the terminals between the secondary cells can be set to be smaller than that in the battery monitoring circuit according to the related art, the circuit scale can be reduced.

As described above, according to the battery monitoring circuit in this embodiment, the circuit area can be reduced while the voltage of each of the secondary cells connected in series is accurately measured.

In the embodiments described above, the discharging switch elements and the resistors are included in the battery monitoring circuit. However, the discharging switch elements and the resistors may be included in a circuit (e.g. external circuit) separated from the battery monitoring circuit.

In the embodiments described above, the voltage is measured in an order of the secondary cells from the one having the lower voltage to the one having the higher voltage. However, the voltage may be measured in an order of the secondary cells from the one having the higher voltage to the one having the lower voltage.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A battery monitoring circuit that monitors voltages of a plurality of secondary cells connected in series, the battery monitoring circuit comprising:
    a first switch element with a first end connected to a first terminal, the first terminal connected to a first potential line and connected to a negative electrode of a first secondary cell;
    a second switch element with a first end connected to a second terminal and a second end connected to a second end of the first switch element, the second terminal connected to a positive electrode of the first secondary cell and a negative electrode of a second secondary cell;
    a third switch element with a first end connected to a third terminal and a second end connected to the second end of the first switch element, the third terminal connected to a second potential line and connected to a positive electrode of the second secondary cell;
    a first capacitor with a first end connected to the second end of the first switch element;
    an operational amplifier with an inverting input terminal connected to a second end of the first capacitor, a non-inverting input terminal connected to a fixed potential, and an output connected to the second end of the first capacitor;
    an A/D converter configured to perform analog-to-digital conversion of a signal output by the operational amplifier to obtain a digital signal, and to output the digital signal; and
    a control circuit configured to control an on state and an off state of the first, the second, and the third switch elements and to control operation of the operational amplifier and the A/D converter.

2. The battery monitoring circuit of claim 1, wherein
    to detect a first voltage of the first secondary cell from a state in which the first, the second, and the third switch elements are turned off while operation of the operational amplifier and the A/D converter is stopped, the control circuit turns on the first switch element and operates the operational amplifier, then the control circuit turns off the first switch element and stops operation of the operational amplifier, then the control circuit turns on the second switch element, and then the control circuit operates the A/D converter, wherein the A/D converter outputs a first digital signal based on the first voltage of the first secondary cell; and
    to detect a second voltage of the second secondary cell, the control circuit operates the operational amplifier, then the control circuit turns off the second switch element and stops operation of the operational amplifier, then the control circuit turns on the third switch element, and then the control circuit operates the A/D converter, wherein the A/D converter outputs a second digital signal based on the second voltage of the second secondary cell.

3. The battery monitoring circuit of claim 1, wherein
    to detect a first voltage of the first secondary cell from a state in which the first, the second, and the third switch elements are turned off while operation of the operational amplifier and the A/D converter are stopped, the control circuit turns on the first switch element and operates the operational amplifier and the A/D converter, wherein the A/D converter outputs a first digital signal, then the control circuit turns off the first switch element and stops operation of the operational amplifier, then the control circuit turns on the second switch element, then the control circuit operates the A/D converter, wherein the A/D converter outputs a second digital signal based on the first voltage of the first secondary cell; and
    to detect a second voltage of the second secondary cell, the control circuit operates the operational amplifier and the A/D converter, wherein the A/D converter outputs a third digital signal, then the control circuit turns off the second switch element and stops the operation of the operational amplifier, then the control circuit turns on the third switch element, then the control circuit operates the A/D converter, wherein the A/D converter outputs a fourth digital signal based on the second voltage of the second secondary cell.

4. The battery monitoring circuit of claim 1,
    wherein the operational amplifier includes an operation control switch element configured to control operation of the operational amplifier, and wherein the control circuit is further configured to control an on state and an off state of the control switch element; and when the operational amplifier is operated, the control circuit turns on the operation control switch element, and when the operational amplifier is stopped, the control circuit turns off the operation control switch element.

5. The battery monitoring circuit of claim 2,
wherein the operational amplifier includes an operation control switch element configured to control operation of the operational amplifier, and wherein the control circuit is further configured to control an on state and an off state of the control switch element;
wherein the control circuit is further configured to turn on the operation control switch element in response to operation of the operational amplifier, and
wherein the control circuit is further configured to turn off the operation control switch element in response to operation of the operational amplifier being stopped.

6. The battery monitoring circuit of claim 3,
wherein the operational amplifier includes an operation control switch element configured to control operation of the operational amplifier, and wherein the control circuit is further configured to control an on state and an off state of the control switch element;
wherein the control circuit is further configured to turn on the operation control switch element in response to operation of the operational amplifier, and
wherein the control circuit is further configured to turn off the operation control switch element in response to operation of the operational amplifier being stopped.

7. The battery monitoring circuit of claim 1, further comprising:
a first discharging switch element connected in series to a first resistor, between the first terminal and the second terminal, and controlled by the control circuit; and
a second discharging switch element connected in series to the first resistor and a second resistor, between the second terminal and the third terminal, and controlled by the control circuit,
wherein, when the voltage of the first secondary cell is to be decreased based on the digital signal, the control circuit turns on the first switch element from a state in which the first discharging switch element and the second discharging switch element are turned off, and
wherein, when the voltage of the second secondary cell is to be decreased, the control circuit turns on the second switch element from a state in which the first discharging switch element and the second discharging switch element are turned off.

8. The battery monitoring circuit of claim 2, further comprising:
a first discharging switch element connected in series to a first resistor, between the first terminal and the second terminal, and controlled by the control circuit; and
a second discharging switch element connected in series to the first resistor and a second resistor, between the second terminal and the third terminal, and controlled by the control circuit,
wherein, when the voltage of the first secondary cell is to be decreased based on the digital signal, the control circuit turns on the first switch element from a state in which the first discharging switch element and the second discharging switch element are turned off, and
wherein, when the voltage of the second secondary cell is to be decreased, the control circuit turns on the second switch element from a state in which the first discharging switch element and the second discharging switch element are turned off.

9. The battery monitoring circuit of claim 3, further comprising:
a first discharging switch element connected in series to a first resistor, between the first terminal and the second terminal, and controlled by the control circuit; and
a second discharging switch element connected in series to the first resistor and a second resistor, between the second terminal and the third terminal, and controlled by the control circuit,
wherein, when the voltage of the first secondary cell is to be decreased based on the digital signal, the control circuit turns on the first switch element from a state in which the first discharging switch element and the second discharging switch element are turned off, and
wherein, when the voltage of the second secondary cell is to be decreased, the control circuit turns on the second switch element from a state in which the first discharging switch element and the second discharging switch element are turned off.

10. The battery monitoring circuit of claim 3, wherein the control circuit is further configured to acquire the voltage of the first secondary cell based on the difference between the second digital signal and the first digital signal, and to acquire the voltage of the second secondary cell based on the difference between the fourth digital signal and the third digital signal.

11. A battery monitoring circuit that monitors voltages of a plurality of secondary cells connected in series, the battery monitoring circuit comprising:
a first switch element with a first end connected to a first terminal, the first terminal connected to a first potential line and connected to a negative electrode of a first secondary cell;
a second switch element with a first end connected to a second terminal and a second end connected to a second end of the first switch element, the second terminal connected to a positive electrode of the first secondary cell and a negative electrode of a second secondary cell;
a third switch element with a first end connected to a third terminal and a second end connected to the second end of the first switch element, the third terminal connected to a second potential line and connected to a positive electrode of the second secondary cell;
a first capacitor with a first end connected to the second end of the first switch element;
an operational amplifier with an inverting input terminal connected to a second end of the first capacitor and a non-inverting input terminal connected to a fixed potential;
a second capacitor connected between the inverting input terminal of the operational amplifier and an output of the operational amplifier;
a refresh switch element connected in parallel to the second capacitor, between the inverting input terminal of the operational amplifier and the output of the operational amplifier;
an A/D converter configured to perform analog-to-digital conversion of a signal output by the operational amplifier to obtain a digital signal, and to output the digital signal; and
a control circuit configured to control an on state and an off state of the first, the second, and the third switch elements and the refresh switch element and to control operation of the A/D converter.

12. The battery monitoring circuit of claim 11, wherein,
to detect a first voltage of the first secondary cell, from a state in which the first, the second, and the third switch elements and the refresh switch element are turned off while operation of the A/D converter is stopped, the control circuit turns on the second switch element and the refresh switch element, then the control circuit turns off the second switch element and the refresh switch element, then the control circuit turns on the first switch element, and then the control circuit operates the A/D converter, wherein the A/D converter outputs a first digital signal based on the first voltage of the first secondary cell, and to detect a second voltage of the second secondary cell, the control circuit turns off the first switch element, the control circuit turns on the third switch element and the refresh switch element, then the control circuit turns off the third switch element and the refresh switch element, then the control circuit turns on the second switch element, and then the control circuit operates the A/D converter, wherein the A/D converter outputs a second digital signal based on a second voltage of the second secondary cell.

13. The battery monitoring circuit of claim 11, wherein,
to detect a first voltage of the first secondary cell from a state in which the first, the second, and the third switch elements and the refresh switch element are turned off while operation of the A/D converter is stopped, the control circuit turns on the second switch element and the refresh switch element, then the control circuit operates the A/D converter, wherein the A/D converter outputs a first digital signal, then the control circuit turns off the second switch element and the refresh switch element, then the control circuit turns on the first switch element, then the control circuit operates the A/D converter, wherein the A/D converter outputs a second digital signal based on the first voltage of the first secondary cell, and to detect a second voltage of the second secondary cell, the control circuit turns off the first switch element, then the control circuit turns on the third switch element and the refresh switch element, then the control circuit operates the A/D converter, wherein the A/D converter outputs a third digital signal, then the control circuit turns off the third switch element and the refresh switch element, then the control circuit turns on the second switch element, then the control circuit operates the A/D converter, wherein the A/D converter outputs a fourth digital signal based on a second voltage of the second secondary cell.

14. The battery monitoring circuit of claim 11, further comprising:
a first discharging switch element connected in series to a first resistor, between the first terminal and the second terminal, and controlled by the control circuit; and
a second discharging switch element connected in series to the first resistor and a second resistor, between the second terminal and the third terminal, and controlled by the control circuit,
wherein, when the voltage of the first secondary cell is to be decreased based on the digital signal, the control circuit turns on the first switch element from a state in which the first discharging switch element and the second discharging switch element are turned off, and
wherein, when the voltage of the second secondary cell is to be decreased, the control circuit turns on the second switch element from a state in which the first discharging switch element and the second discharging switch element are turned off.

15. The battery monitoring circuit of claim 12, further comprising:
a first discharging switch element connected in series to a first resistor, between the first terminal and the second terminal, and controlled by the control circuit; and
a second discharging switch element connected in series to the first resistor and a second resistor, between the second terminal and the third terminal, and controlled by the control circuit,
wherein, when the voltage of the first secondary cell is to be decreased based on the digital signal, the control circuit turns on the first switch element from a state in which the first discharging switch element and the second discharging switch element are turned off, and
wherein, when the voltage of the second secondary cell is to be decreased, the control circuit turns on the second switch element from a state in which the first discharging switch element and the second discharging switch element are turned off.

16. The battery monitoring circuit of claim 13, further comprising:
a first discharging switch element connected in series to a first resistor, between the first terminal and the second terminal, and controlled by the control circuit; and
a second discharging switch element connected in series to the first resistor and a second resistor, between the second terminal and the third terminal, and controlled by the control circuit,
wherein, when the voltage of the first secondary cell is to be decreased based on the digital signal, the control circuit turns on the first switch element from a state in which the first discharging switch element and the second discharging switch element are turned off, and
wherein, when the voltage of the second secondary cell is to be decreased, the control circuit turns on the second switch element from a state in which the first discharging switch element and the second discharging switch element are turned off.

17. The battery monitoring circuit of claim 13, wherein the control circuit is further configured to acquire the voltage of the first secondary cell based on the difference between the second digital signal and the first digital signal, and to acquire the voltage of the second secondary cell based on the difference between the fourth digital signal and the third digital signal.

18. A battery monitoring system that monitors voltages of a plurality of secondary cells connected in series, the battery monitoring system comprising:
a first secondary cell;
a second secondary cell, the first secondary cell and the second secondary cell connected in series; and
a battery monitoring circuit configured to monitor voltages of the first secondary cell and the second secondary cell,
wherein the battery monitoring circuit comprises:
a first switch element with a first end connected to a first terminal, the first terminal connected to a first potential line and connected to a negative electrode of the first secondary cell;
a second switch element with a first end connected to a second terminal and a second end connected to a second end of the first switch element, the second terminal connected to a positive electrode of the first secondary cell and a negative electrode of the second secondary cell;

a third switch element with a first end connected to a third terminal and a second end connected to the second end of the first switch element, the third terminal connected to a second potential line and connected to a positive electrode of the second secondary cell;

a first capacitor with a first end connected to the second end of the first switch element;

an operational amplifier with an inverting input terminal connected to a second end of the first capacitor and a non-inverting input terminal connected to a fixed potential;

a second capacitor connected between the inverting input terminal of the operational amplifier and an output of the operational amplifier;

a refresh switch element connected in parallel to the second capacitor, between the inverting input terminal of the operational amplifier and the output of the operational amplifier;

an A/D converter configured to perform analog-to-digital conversion of a signal output by the operational amplifier to obtain a digital signal and to output the digital signal; and a control circuit configured to control an on state and an off state of the first, the second, and the third switch elements and the refresh switch element and to control operation of the A/D converter.

19. The battery monitoring system of claim 18, wherein, to detect a first voltage of the first secondary cell, from a state in which the first, the second, and the third switch elements and the refresh switch element are turned off while operation of the A/D converter is stopped, the control circuit turns on the second switch element and the refresh switch element, then the control circuit turns off the second switch element and the refresh switch element, then the control circuit turns on the first switch element, and then the control circuit operates the A/D converter, wherein the A/D converter outputs a first digital signal based on the first voltage of the first secondary cell, and to detect a second voltage of the second secondary cell, the control circuit turns off the first switch element, the control circuit turns on the third switch element and the refresh switch element, then the control circuit turns off the third switch element and the refresh switch element, then the control circuit turns on the second switch element, and then the control circuit operates the A/D converter, wherein the A/D converter outputs a second digital signal based on the second voltage of the second secondary cell.

20. The battery monitoring system of claim 18, wherein, to detect a first voltage of the first secondary cell from a state in which the first, the second, and the third switch elements and the refresh switch element are turned off while operation of the A/D converter is stopped, the control circuit turns on the second switch element and the refresh switch element, then the control circuit operates the A/D converter, wherein the A/D converter outputs a first digital signal, then the control circuit turns off the second switch element and the refresh switch element, then the control circuit turns on the first switch element, then the control circuit operates the A/D converter, wherein the A/D converter outputs a second digital signal based on the first voltage of the first secondary cell, and to detect a second voltage of the second secondary cell, the control circuit turns off the first switch element, then the control circuit turns on the third switch element and the refresh switch element, then the control circuit operates the A/D converter, wherein the A/D converter outputs a third digital signal, then the control circuit turns off the third switch element and the refresh switch element, then the control circuit turns on the second switch element, then the control circuit operates the A/D converter, wherein the A/D converter outputs a fourth digital signal based on the second voltage of the second secondary cell.

* * * * *